United States Patent
Wei et al.

(10) Patent No.: US 11,095,402 B2
(45) Date of Patent: Aug. 17, 2021

(54) TECHNIQUES FOR HYBRID CHASE COMBINING AND INCREMENTAL REDUNDANCY HARQ WITH POLAR CODES

(71) Applicant: QUALCOMM Incorporated, San Diego, CA (US)

(72) Inventors: Chao Wei, Beijing (CN); Jing Jiang, San Diego, CA (US); Changlong Xu, Beijing (CN); Jilei Hou, Beijing (CN)

(73) Assignee: QUALCOMM Incorporated, San Diego, CA (US)

( * ) Notice: Subject to any disclaimer, the term of this patent is extended or adjusted under 35 U.S.C. 154(b) by 4 days.

(21) Appl. No.: 16/345,621

(22) PCT Filed: Dec. 22, 2017

(86) PCT No.: PCT/CN2017/117931
§ 371 (c)(1),
(2) Date: Apr. 26, 2019

(87) PCT Pub. No.: WO2018/126906
PCT Pub. Date: Jul. 12, 2018

(65) Prior Publication Data
US 2019/0280829 A1 Sep. 12, 2019

(30) Foreign Application Priority Data
Jan. 6, 2017 (WO) ................ PCT/CN2017/070392

(51) Int. Cl.
*H03M 13/00* (2006.01)
*H04L 1/18* (2006.01)
(Continued)

(52) U.S. Cl.
CPC .......... *H04L 1/1896* (2013.01); *H03M 13/13* (2013.01); *H03M 13/2906* (2013.01);
(Continued)

(58) Field of Classification Search
None
See application file for complete search history.

(56) References Cited

U.S. PATENT DOCUMENTS 9,059,846 B2 * 6/2015 Mo ....................... H04L 1/1819
2007/0113147 A1   5/2007 Hong et al.
(Continued)

FOREIGN PATENT DOCUMENTS

CN          101174931 A       5/2008

OTHER PUBLICATIONS

International Search Report and Written Opinion—PCT/CN2017/070392—ISA/EPO—dated Apr. 7, 2014.
(Continued)

*Primary Examiner* — Guerrier Merant
(74) *Attorney, Agent, or Firm* — Arent Fox LLP

(57) ABSTRACT

The present disclosure describes various examples of a method, an apparatus, and a computer-readable medium for wireless communications (e.g., 5G NR) using hybrid automatic repeat request (HARQ). For example, one of the methods includes generating a first codeword based on a first code block length, transmitting a first signal using the first codeword, generating a second codeword with incremental redundancy information based on a second code block length, generating a third codeword with repetition of at least a portion of the first codeword based on a third code block length, and transmitting a second signal using at least the second codeword or the third codeword.

27 Claims, 7 Drawing Sheets

(51) Int. Cl.
*H03M 13/13* (2006.01)
*H03M 13/29* (2006.01)

(52) U.S. Cl.
CPC ... *H03M 13/6306* (2013.01); *H03M 13/6368* (2013.01); *H04L 1/1819* (2013.01)

(56) References Cited

U.S. PATENT DOCUMENTS

| | | | |
|---|---|---|---|
| 2008/0294967 | A1 | 11/2008 | Tomlinson et al. |
| 2012/0320994 | A1* | 12/2012 | Loghin ............ H03M 13/11 375/240.27 |
| 2014/0143639 | A1* | 5/2014 | Loghin ............ H03M 13/618 714/776 |
| 2016/0285479 | A1 | 9/2016 | El-Khamy et al. |
| 2020/0259622 | A1* | 8/2020 | Cao ............ H04L 1/1819 |

OTHER PUBLICATIONS

International Search Report and Written Opinion—PCT/CN2017/117931—ISA/EPO—dated Feb. 24, 2018.
Saber H., et al., "An Incremental Redundancy Hybrid ARQ Scheme via Puncturing and Extending of Polar Codes", IEEE Transactions on Communications, Nov. 30, 2015, vol. 63, No. 11, pp. 3964-3973.
El-Khamy M., et al.," HARQ Rate-Compatible Polar Codes for Wireless Channels ", 2015 IEEE Global Communications Conference (GLOBECOM), Jan. 1, 2014 (Jan. 1, 2014), pp. 1-6, XP055397700, DOI: 10.1109/GLOCOM.2014.7417429* Section I and III, figures 4,5.
Huawei, et al., "HARQ Scheme for Polar Codes," 3GPP Draft, 3GPP TSG RAN WG1 Meeting #87, R1-1613301, HARQ Scheme for Polar Codes, 3rd Generation Partnership Project (3GPP), Mobile Competence Centre; 650, Route Des Lucioles; F-06921 Sophia-Antipolis Cedex; France, vol. RAN WG1, No. Reno, USA; Nov. 14, 2016-Nov. 18, 2016, Nov. 19, 2016, XP051191170, 41 Pages, Retrieved from the Internet: URL: http://www.3gpp.org/ftp/tsg_ran/WG1_RL1/TSGR1_87/Docs/ [retrieved on Nov. 19, 2016], Section 2, figures 4,5.
Supplementary European Search Report—EP17890501—Search Authority—Munich—Sep. 8, 2020.

* cited by examiner

TECHNIQUES FOR HYBRID CHASE COMBINING AND INCREMENTAL REDUNDANCY HARQ WITH POLAR CODES

CROSS-REFERENCE TO RELATED APPLICATION

This application is a 35 U.S.C. § 371 National Phase Application of PCT Application No. PCT/CN2017/117931 filed Dec. 22, 2017, entitled "TECHNIQUES FOR HYBRID CHASE COMBINING AND INCREMENTAL REDUNDANCY HARQ WITH POLAR CODES," which claims priority to PCT Application No. PCT/CN2017/070392 filed Jan. 6, 2017, entitled "TECHNIQUES FOR HYBRID CHASE COMBINING AND INCREMENTAL REDUNDANCY HARQ WITH POLAR CODES." The disclosure of these prior applications are hereby incorporated by reference herein in their entirety.

BACKGROUND

The present disclosure relates generally to wireless communications systems (e.g., 5G New Radio), and more particularly, to techniques for hybrid automatic repeat request (HARQ) using chase combining and incremental redundancy mechanism with polar codes.

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is Long Term Evolution (LTE) or LTE-Advanced (LTE-A). However, although newer multiple access systems, such as an LTE or LTE-A system, deliver faster data throughput than older technologies, such increased downlink rates have triggered a greater demand for higher-bandwidth content, such as high-resolution graphics and video, for use on or with mobile devices. As such, demand for bandwidth, higher data rates, better transmission quality as well as better spectrum utilization, and lower latency on wireless communications systems continues to increase.

The 5th Generation (5G) New Radio (NR) communications technology, used in a wide range of spectrum, is envisaged to expand and support diverse usage scenarios and applications with respect to current mobile network generations. In an aspect, 5G NR communications technology includes, for example: enhanced mobile broadband (eMBB) addressing human-centric use cases for access to multimedia content, services and data; ultra-reliable low-latency communications (URLLC) with strict requirements, especially in terms of latency and reliability; and massive machine type communications (mMTC) for a very large number of connected devices and typically transmitting a relatively low volume of non-delay-sensitive information. As the demand for mobile broadband access continues to increase, there exists a need for further improvements in 5G communications technology and beyond. Preferably, these improvements should be applicable to other multi-access technologies and the telecommunication standards that employ these technologies.

Accordingly, due to the requirements for increased data rates, higher capacity, low latency, and low complexity, new approaches may be desirable to improve the system reliability for data transmission and retransmission by using flexible and enhanced coding/decoding techniques, in order to satisfy consumer demand and improve user experience in wireless communications, e.g., 5G NR communications.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In accordance with an aspect, methods, apparatus, and computer-readable medium relate to hybrid automatic repeat request (HARQ) transmissions and receptions. According to one example, a method of HARQ transmission is provided. The method may include generating a first codeword based on a first code block length; transmitting a first signal using the first codeword; generating a second codeword with incremental redundancy information based on a second code block length; generating a third codeword with repetition of at least a portion of the first codeword based on a third code block length; and transmitting a second signal using at least the second codeword or the third codeword.

In another example, an apparatus for HARQ transmission is provided. The apparatus includes means for generating a first codeword based on a first code block length; means for transmitting a first signal using the first codeword; means for generating a second codeword with incremental redundancy information based on a second code block length; means for generating a third codeword with repetition of at least a portion of the first codeword based on a third code block length; and means for transmitting a second signal using at least the second codeword or the third codeword.

In a further example, an apparatus for HARQ transmission is provided. The apparatus includes a memory configured to store instructions; at least one processor coupled to the memory, the at least one processor is configured to execute the instructions to: generate a first codeword based on a first code block length; generate a second codeword with incremental redundancy information based on a second code block length; and generate a third codeword with repetition of at least a portion of the first codeword based on a third code block length; and a transmitter coupled to the at least one processor and configured to transmit a first signal using the first codeword, and transmit a second signal using at least the second codeword or the third codeword.

Additionally, in another example, a computer readable medium storing computer executable code for HARQ transmission is provided. The computer readable medium includes code for generating a first codeword based on a first code block length; code for transmitting a first signal using the first codeword; code for generating a second codeword with incremental redundancy information based on a second code block length; code for generating a third codeword with repetition of at least a portion of the first codeword based on a third code block length; and code for transmitting a second signal using at least the second codeword or the third codeword.

In accordance with another aspect, methods, apparatus, and computer-readable medium relate to HARQ transmissions and receptions. According to one example, a method of wireless communications using HARQ is provided. The method may include receiving a first signal using a first codeword based on a first code block length; receiving a second signal using at least a second codeword or a third codeword; determining a second code block length for the second signal; determining whether the second signal using the second codeword, the third codeword, or a hybrid codeword including the second codeword and the third codeword, based on determining whether the second code block length for the second signal is an integer multiple of the first code block length for the first signal; and decoding the second signal based on the determined codeword used in the second signal.

In another example, an apparatus for wireless communications using HARQ is provided. The apparatus includes a receiver configured to receive a first signal using a first codeword based on a first code block length, and a second signal using at least a second codeword or a third codeword; a memory configured to store instructions; and at least one processor coupled to the memory and the receiver, the at least one processor is configured to execute the instructions to: determine a second code block length for the second signal; determine whether the second signal using the second codeword, the third codeword, or a hybrid codeword including the second codeword and the third codeword, based on determining whether the second code block length for the second signal is an integer multiple of the first code block length for the first signal; and decode the second signal based on the determined codeword used in the second signal.

In a further example, an apparatus for wireless communications using HARQ is provided. The apparatus includes means for receiving a first signal using a first codeword based on a first code block length; means for receiving a second signal using at least a second codeword or a third codeword; means for determining a second code block length for the second signal; means for determining whether the second signal using the second codeword, the third codeword, or a hybrid codeword including the second codeword and the third codeword, based on determining whether the second code block length for the second signal is an integer multiple of the first code block length for the first signal; and means for decoding the second signal based on the determined codeword used in the second signal.

Additionally, in another example, a computer readable medium storing computer executable code for wireless communications using HARQ is provided. The computer readable medium includes code for receiving a first signal using a first codeword based on a first code block length; code for receiving a second signal using at least a second codeword or a third codeword; code for determining a second code block length for the second signal; code for determining whether the second signal using the second codeword, the third codeword, or a hybrid codeword including the second codeword and the third codeword, based on determining whether the second code block length for the second signal is an integer multiple of the first code block length for the first signal; and code for decoding the second signal based on the determined codeword used in the second signal.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The accompanying drawings are presented to aid in the description of various aspects of the disclosure and are provided solely for illustration of the aspects and not limitation thereof. The drawings include like reference numbers for like elements, and may represent optional components or actions using dashed lines.

DETAILED DESCRIPTION

Figure 1:
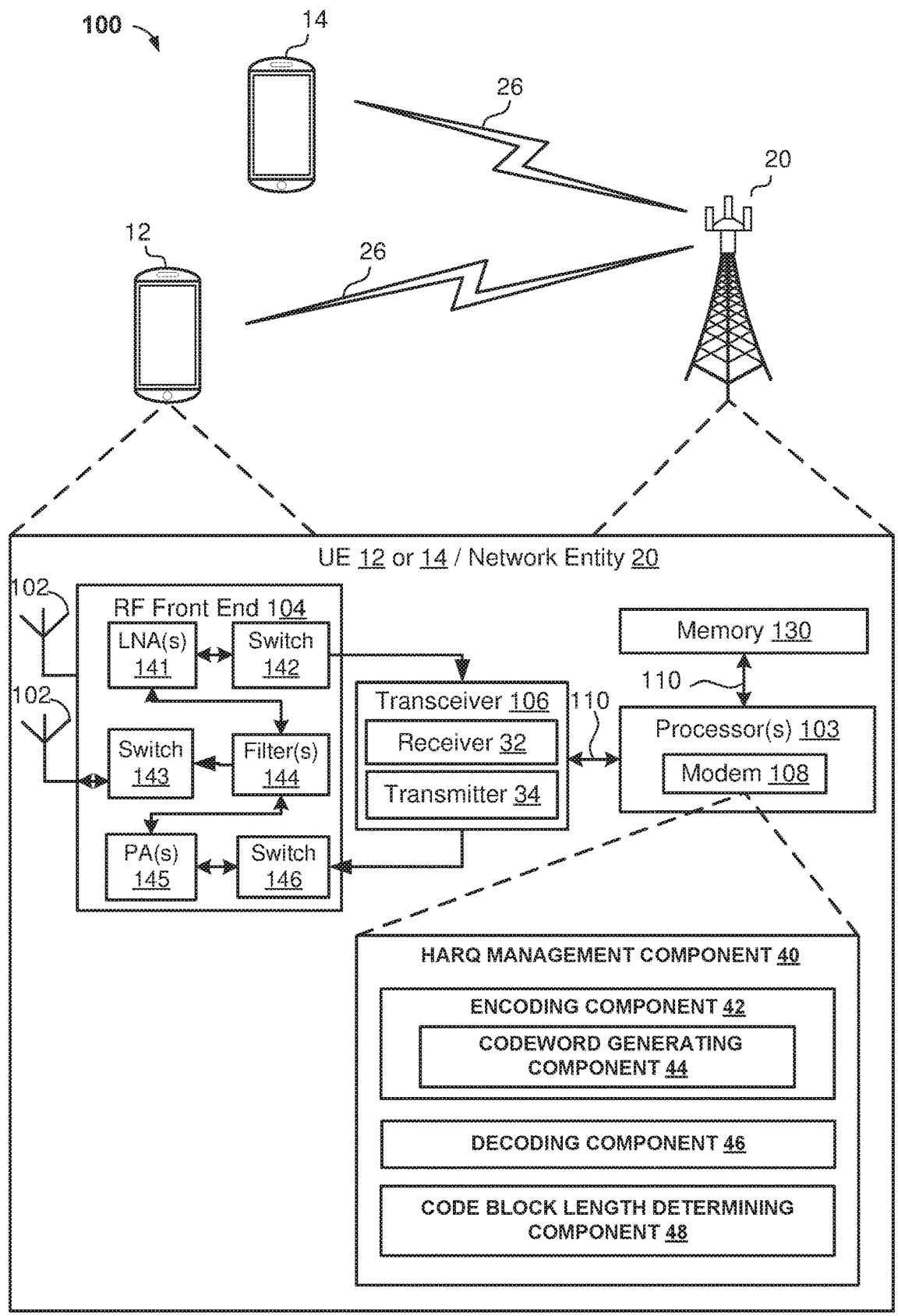
FIG. 1 is a diagram illustrating an example of a wireless communications system (e.g., 5G NR) including a base station and one or more user equipments (UE) having an aspect of a hybrid automatic repeat request (HARQ) management component as described herein for HARQ transmissions and receptions in accordance with various aspects of the present disclosure.

In wireless communications (e.g., 5G NR), as the demand for increased data rates, higher capacity, low latency, and low complexity, some existing hybrid automatic repeat request (HARQ) schemes may not be able to meet the requirements. For example, some existing HARQ schemes may not support flexible and fine coding rate adaptation for retransmission, or may not support self-decoding for retransmission. In this case, new approaches using a hybrid chase combining and incremental redundancy mechanism with polar codes for HARQ communications may be desirable to improve the system reliability for data transmission(s) and/or retransmission(s).

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example aspects, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM, a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

In some implementations, polar codes are used for wireless communications. In some aspects, polar codes can be used to achieve the capacity of the binary-input discrete memoryless channels using a low complexity successive cancellation (SC) decoder. By concatenating with an outer encoder to improve the code minimum distance, the polar code may achieve similar performance as the well-optimized low-density parity-check (LDPC) codes for small block lengths. Due to good performance and low complexity, the polar codes may be used as a coding scheme for control channel in a wireless communications system (e.g., 5G NR). In an aspect, polar codes may be used for ultra-reliable low-latency communications (URLLC), for example, communications over data channel where HARQ is used and supported.

For polar codes, in some implementations, an incremental redundancy (IR) HARQ scheme may utilize the recursive structure of polar codes, for example, the last 2m codeword bits of a (2m+x) codeword may be itself a smaller polar mother code word. In an example, for a first transmission, a polar code ($M_1$, K) with $M_1$ for the code block size, and K for the number of information bits being constructed by rate matching from a mother code length of $N_1$. For each retransmission (e.g., a second transmission or a third transmission), the mother code length may be extended from N1 to $\beta \times N_1$ (e.g., where $\beta$ may be 2, 3, or 4, etc.), and the encoder may generate a longer codeword with redundant information bits, but may only transmit the incremental redundancy part. On the other side, at the decoder, the received log-likelihood ratios (LLRs) of all transmissions are combined and decode as a long codeword of $\beta \times N_1$.

There may be some issues or challenges with the existing IR-HARQ scheme. For example, at first, the existing IR-HARQ scheme may not support flexible and fine coding rate adaptation for retransmission since the block length for retransmission(s) may need to be an integer multiple of the first transmission block size or code block length. Second, the existing IR-HARQ scheme may not support self-decoding for retransmission(s) which may result in retransmission(s) failures when the data of the first transmission is missed and/or not available for HARQ combining.

In particular, the above discussed IR-HARQ scheme may assume the code block length for each retransmission shall be a multiple of the block length of the first transmission, e.g., $M_i = \beta \times M_1$, where $\beta$ may be 2, 3, or 4, etc. In each retransmission, only the incremental redundancy part of a longer codeword is transmitted which is XOR with the codeword of the first transmission. The multiple block length restriction may not support flexible and fine coding rate adaptation for retransmission according to channel condition. In an example, the coding rate may be changed to R/2, R/3, R/4, etc, during retransmission(s). If the desired coding rate for the second transmission is between R/2 and R/3, then the lower coding rate R/3 is selected resulting in unnecessarily allocating maximum of R/6 resources for retransmission(s).

Still referring to the IR-HARQ scheme described above, the incremental redundancy codeword may be a lower part of a long codeword, and therefore may be not self-decodable. If the channel condition for the first transmission is very bad (e.g., due to interference), for example, the received LLRs are very small not able to contribute to the decoding, retransmission may fail also by decoding only the incremental redundancy codeword even when the channel condition(s) for the second transmission is very good.

The present disclosure relates to wireless communications using hybrid automatic repeat request (HARQ) at a user equipment (LE) and/or a base station. In an aspect, a hybrid codeword for retransmission is proposed. For example, for each retransmission, transmitting and receiving a hybrid chase combining and incremental redundancy codeword may be supported. In another aspect, either one of a chase combining (CC) and/or an incremental redundancy (IR) codeword may be used in retransmission(s). In some implementations, a codeword may be a code block, or in general, a code used for encoding/decoding. In an aspect, a codeword may use one or more polar codes discussed herein.

In some aspects, wireless communications may use one or more hybrid codeword(s) for HARQ communications by combining a chase combining codeword and an incremental redundancy codeword for transmissions/retransmissions and/or receptions. In an aspect, a chase combining codeword may be a repetition of part of the first transmission (TX) codeword, and an incremental redundancy codeword may be a long codeword encoded with redundant information bits and an exclusive-OR (XOR) operation with the codeword of the first TX. In an implementation, for example, for a given code block length of $M_1$ (e.g., for the first TX) and $M_2$ (e.g., for the second TX), the code block length of incremental redundancy codeword may be determined by floor($M_2/M_1$)× $M_1$, and the code block length of the chase combining codeword may be determined by the remaining part, e.g., $M_2$−floor($M_2/M_1$)×$M_1$. In this example, chase combining codeword may be a repetition of part of the 1st TX code word, and an incremental redundancy codeword may be the lower part of a long codeword encoded with redundant information bits and XOR with the codeword of the first TX.

In an aspect, for construction of a chase combining codeword, two options may be considered:

First Option: copy the last $\Delta M=(M_2-\beta M_1)$ coded bits from the 1st transmission codeword or code block $C_1$; or Second Option: Bit-reversal puncturing the codeword or code block $C_1$ to the desired length $\Delta M$, or equivalently bit-reversal the ascending-ordered binary indices [0, 1, . . . , $N_1$−2, $N_1$−1] Where $N_1$ is the mother code block length for the 1st transmission and select the coded bits on the first $\Delta M$ indices with the lowest values. In such case, it may be close to a uniform repetition.

Figure 5:
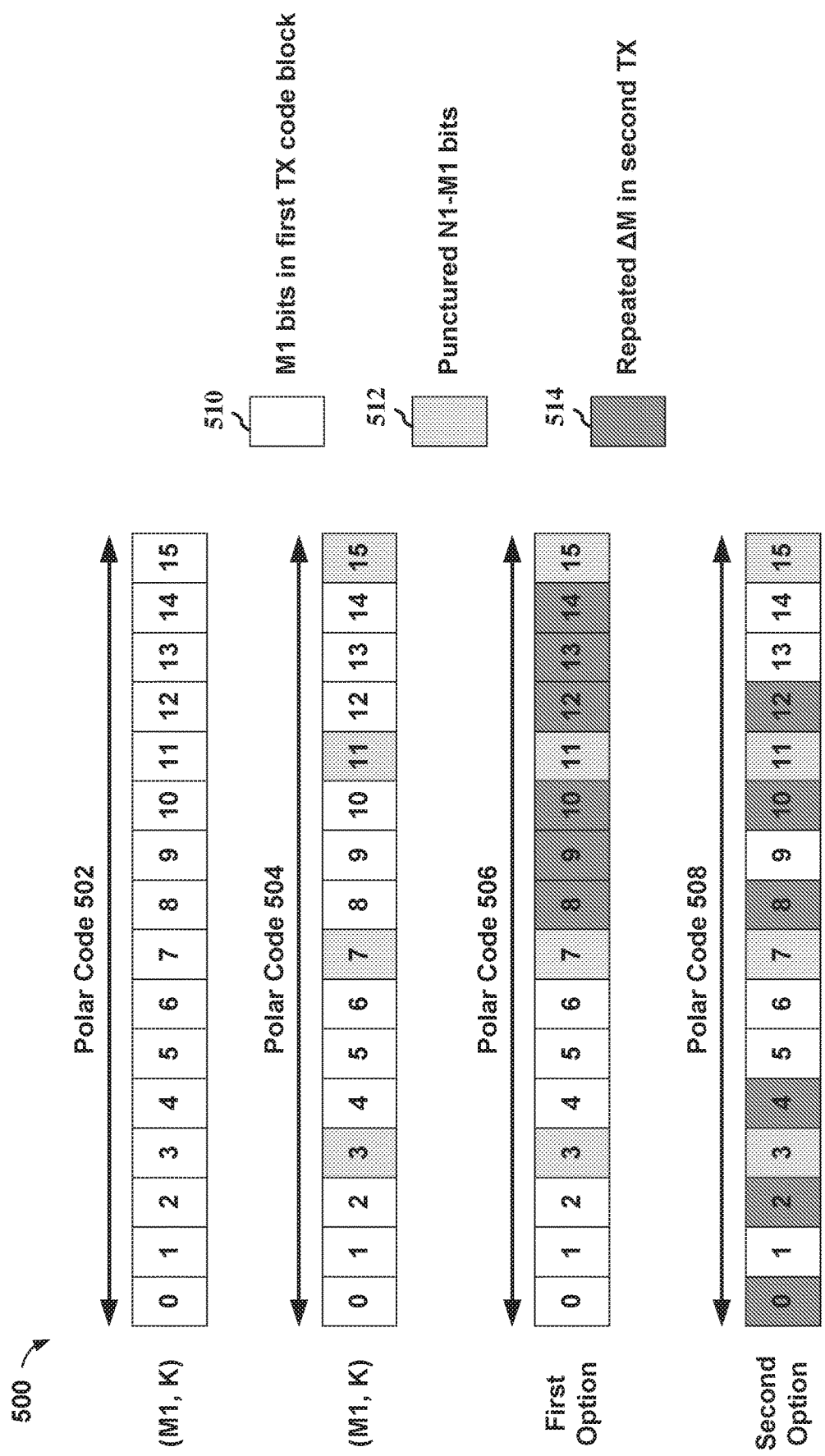
FIG. 5 is a diagram illustrating examples of construction of chase combining codeword(s) in accordance with various aspects of the present disclosure.

In an example, construction of chase combining codeword using Second Option (e.g., bit reversal based repetition) may be shown as following and in FIG. 5, Assuming $N_1$=16, $M_1$=12, $\Delta M$=6, there are $N_1$−$M_1$=4 bits to be punctured to obtain the first transmission codeword or code block $C_1$, the puncturing pattern is the bit-reversal of the last $N_1$−$M_1$ indices, e.g., P=[15 (1111), 7(0111), 11(1011), 3(0011)]=[BitRev($N_1$−1), BitRev($N_1$−2), BitRev($N_1$−$M_1$)];

For selecting $\Delta M$ repeated bits for second TX, puncturing additional ($M_1$−$\Delta M$) coded bits with the indices, P'= [13(1101), 5(0101), 9(1001), 1(0001), 14(1110), 6(0110)] and therefore the coded bits on indices R=[(0000), 8(1000), 4(0100), 12(1100), 2(0010), 10(1010)]=[BitRev(0), . . . , BitRev($\Delta M$−2, BitRev ($\Delta M$−1)].

In another aspect, a UE may assist the code block length determination for retransmission(s). In an aspect, the determination of the code block length $M_2$ for retransmission can also be based on X-bits feedback by the UE. For example, bit 0 could be used for indicating whether to have or transmit a chase combining codeword. In another example, bit 1−(X− 1) may be used for indicating the code block scaling factor for the incremental redundancy codeword, e.g., 2×$M_1$, 3×$M_1$, 4×$M_1$, etc.

In an aspect, the determination of the need for chase combining codeword may be based on the received log-likelihood ratios (LLRs) of the first TX codeword and/or using polar code list decoding metric or matrix. For example, if there are too many received LLRs or the list decoding metric less than a threshold then it may imply the first codeword is not well received and a chase combining codeword is needed for retransmission.

Referring to FIG. 1, in an aspect, a wireless communication system 100 (e.g., a 5G NR system) includes at least a UE 12 or a UE 14 in communication coverage of at least a network entity 20 (e.g., a base station or an eNB, or a cell thereof, in an LIE or a 5G NR network). The UE 12 and/or the UE 14 may communicate with a network via the network entity 20. In some aspects, multiple UEs including the UE 12 and/or the UE 14 may be in communication coverage with one or more network entities, including the network entity 20. In an aspect, the network entity 20 may be a base station (e.g., an eNodeB/eNB or a gNB in a 5G NR network, and/or in an LIE network). Although various aspects are described in relation to the Universal Mobile Telecommunications System (UMTS), LTE, or 5G NR networks, similar principles may be applied in other wireless wide area networks (WWAN). The wireless network may employ a scheme where multiple base stations may transmit on a channel. In an example, the UE 12 and/or the UE 14 may transmit and/or receive wireless communications to and/or from the network entity 20. For example, the UE 12 and/or UE 14 may be actively communicating with the network entity 20.

In some aspects, the UE 12 and/or UE 14 may also be referred to by those skilled in the art (as well as interchangeably herein) as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a terminal, a user agent, a mobile client, a client, or some other suitable terminology. The UE 12 and/or UE 14 may be a cellular phone, a personal digital assistant (PDA), a wireless modem, a wireless communication device, a handheld device, a tablet computer, a laptop computer, a cordless phone, a wireless local loop (VU) station, a global positioning system (GPS) device, a multimedia device, a video device, a digital audio player (e.g., MP3 player), a camera, a game console, a wearable computing device (e.g., a smart-watch, smart-glasses, a health or fitness tracker, etc.), an appliance, a sensor, a vehicle communication system, a medical device, a vending machine, a device for the Internet-of-Things, or any other similar functioning device.

Additionally, the network entity 20 may be a macrocell, picocell, femtocell, relay, Node B, mobile Node B, gNB, small cell box, UE (e.g., communicating in peer-to-peer or ad-hoc mode with UE 12 and/or UE 14), or substantially any type of component that can communicate with the UE 12 and/or UE 14 to provide wireless network access at the UE 12 and/or UE 14. In network communication systems using LTE/LTE-A, 5G NR, or similar communication technologies, the term base station may be used to describe the network entity 20, though concepts described herein may be applied to other types of network entity in other types of communication technologies. For example, the wireless communications system 100 may be in a 5G NR or an LTE network, in which different types of network entities provide coverage for various geographical regions. For example, the network entity 20 may provide communication coverage for a macro cell, a pico cell, a femto cell, and/or other types of cell. Small cells such as pico cells, femto cells, and/or other types of cells may include low power nodes (LPNs).

According to the present aspects, the UE 12, the UE 14, and/or the network entity 20 may include one or more processors 103 and a memory 130 that may operate in combination with a HARQ management component 40 to control an encoding component 42 (and/or its sub-component, a codeword generating component 44), a decoding component 46, and/or a code block length determining component 48 for performing HARQ management and operations as described herein. Similarly, the network entity 20 may include one or more processors 103 and a memory 130 that may operate in combination with a HARQ management component 40 to control an encoding component 42 (and/or its sub-component, a codeword generating component 44), a decoding component 46, and/or a code block length determining component 48 for performing HARQ management and operations as described herein.

For example, the HARQ management component 40 may perform HARQ transmissions using chase combining and incremental redundancy mechanism with polar codes. In an aspect, the term "component" as used herein may be one of the parts that make up a system, may be hardware, firmware, and/or software, and may be divided into other components. The HARQ management component 40 may be communicatively coupled to a transceiver 106, which may include a receiver 32 for receiving and processing RF signals and a transmitter 34 for processing and transmitting RF signals. The HARQ management component 40 may include the encoding component 42 (and/or its sub-component, the codeword generating component 44), the decoding component 46, and/or the code block length determining component 48 for performing HARQ management and operations. The processor 103 may be coupled to the transceiver 106 and memory 130 via at least one bus 110.

The receiver 32 may include hardware, firmware, and/or software code executable by a processor for receiving data, the code comprising instructions and being stored in a memory (e.g., computer-readable medium). The receiver 32 may be, for example, a radio frequency (RF) receiver. In an aspect, the receiver 32 may receive signals transmitted by UE 12 and/or UE 14 or network entity 20. The receiver 32 may obtain measurements of the signals. For example, the receiver 32 may determine Ec/Io, SNR, etc.

The transmitter 34 may include hardware, firmware, and/or software code executable by a processor for transmitting data, the code comprising instructions and being stored in a memory (e.g., computer-readable medium). The transmitter 34 may be, for example, a RF transmitter.

In an aspect, the one or more processors 103 can include a modem 108 that uses one or more modem processors. The various functions related to the HARQ management component 40 may be included in modem 108 and/or processors 103 and, in an aspect, can be executed by a single processor, while in other aspects, different ones of the functions may be executed by a combination of two or more different processors. For example, in an aspect, the one or more processors 103 may include any one or any combination of a modem processor, or a baseband processor, or a digital signal processor, or a transmit processor, or a transceiver processor associated with transceiver 106. In particular, the one or more processors 103 may implement components included in the HARQ management component 40, including the encoding component 42 (and/or its sub-component, the codeword generating component 44), the decoding component 46, and/or the code block length determining component 48.

The HARQ management component 40, the encoding component 42 (and/or its sub-component, the codeword generating component 44), the decoding component 46, and/or the code block length determining component 48 may include hardware, firmware, and/or software code executable h a processor for performing random access management and operations. For example, the hardware may include, for example, a hardware accelerator, or specialized processor.

Moreover, in an aspect, the UE 12, the UE 14, and/or the network entity 20 may include RF front end 104 and transceiver 106 for receiving and transmitting radio transmissions, for example, wireless communications 26. For example, transceiver 106 may transmit or receive a signal that includes a pilot signal (e.g., common pilot channel (CPICH). The transceiver 106 may measure the received pilot signal in order to determine signal quality and for providing feedback to the network entity 20. For example, transceiver 106 may communicate with modem 108 to transmit messages generated by HARQ management component 40 and to receive messages and forward them to HARQ management component 40.

RF front end 104 may be connected to one or more antennas 102 and can include one or more low-noise amplifiers (LNAs) 141, one or more switches 142, 143, one or more power amplifiers (PAs) 145, and one or more filters 144 for transmitting and receiving RF signals. In an aspect, components of RF front end 104 can connect with transceiver 106. Transceiver 106 may connect to one or more modems 108 and processor 103.

In an aspect, LNA 141 can amplify a received signal at a desired output level. In an aspect, each LNA 141 may have a specified minimum and maximum gain values. In an aspect, RF front end 104 may use one or more switches 142, 143 to select a particular LNA 141 and its specified gain value based on a desired gain value for a particular application. In an aspect, the RF front end 104 may provide measurements (e.g., Ec/Io) and/or applied gain values to the HARQ management component 40.

Further, for example, one or more PA(s) 145 may be used by RF front end 104 to amplify a signal for an RF output at a desired output power level. In an aspect, each PA 145 may have a specified minimum and maximum gain values. In an aspect, RF front end 104 may use one or more switches 143, 146 to select a particular PA 145 and its specified gain value based on a desired gain value for a particular application.

Also, for example, one or more filters 144 can be used by RF front end 104 to filter a received signal to obtain an input RF signal. Similarly, in an aspect, for example, a respective filter 144 can be used to filter an output from a respective PA 145 to produce an output signal for transmission. In an aspect, each filter 144 can be connected to a specific LNA 141 and/or PA 145. In an aspect, RF front end 104 can use one or more switches 142, 143, 146 to select a transmit or receive path using a specified filter 144, LNA, 141, and/or PA 145, based on a configuration as specified by transceiver 106 and/or processor 103.

Transceiver 106 may be configured to transmit and receive wireless signals through antenna 102 via RF front end 104. In an aspect, transceiver may be tuned to operate at specified frequencies such that UE 12 and/or UE 14 can communicate with, for example, network entity 20. In an aspect, for example, modem 108 can configure transceiver 106 to operate at a specified frequency and power level based on the UE configuration of the UE 12 and/or UE 14 and communication protocol used by modem 108.

In an aspect, modem 108 can be a multiband-multimode modem, which can process digital data and communicate with transceiver 106 such that the digital data is sent and received using transceiver 106. In an aspect, modem 108 can be multiband and be configured to support multiple frequency bands for a specific communications protocol. In an aspect, modem 108 can be multimode and be configured to support multiple operating networks and communications protocols. In an aspect, modem 108 can control one or more components of UE 12 and/or UE 14 or network entity 20 (e.g., RF front end 104, transceiver 106) to enable transmission and/or reception of signals based on a specified modem configuration. In an aspect, the modem configuration can be based on the mode of the modem and the frequency band in use. In another aspect, the modem configuration can be based on UE configuration information associated with UE 12 and/or UE 14 as provided by the network during cell selection and/or cell reselection.

UE 12 and/or UE 14, or network entity 20 may further include memory 130, such as for storing data used herein and/or local versions of applications or HARQ management component 40 and/or one or more of its subcomponents being executed by processor 103. Memory 130 can include any type of computer-readable medium usable by a computer or processor 103, such as random access memory (RAM), read only memory (ROM), tapes, magnetic discs, optical discs, volatile memory, non-volatile memory, and any combination thereof. In an aspect, for example, memory 130 may be a computer-readable storage medium that stores one or more computer-executable codes defining HARQ management component 40 and/or one or more of its subcomponents, and/or data associated therewith, when UE 12 and/or UE 14 and/or network entity 20 is operating processor 103 to execute HARQ management component 40 and/or one or more of its subcomponents. In another aspect, for example, memory 130 may be a non-transitory computer-readable storage medium.

Figure 2:
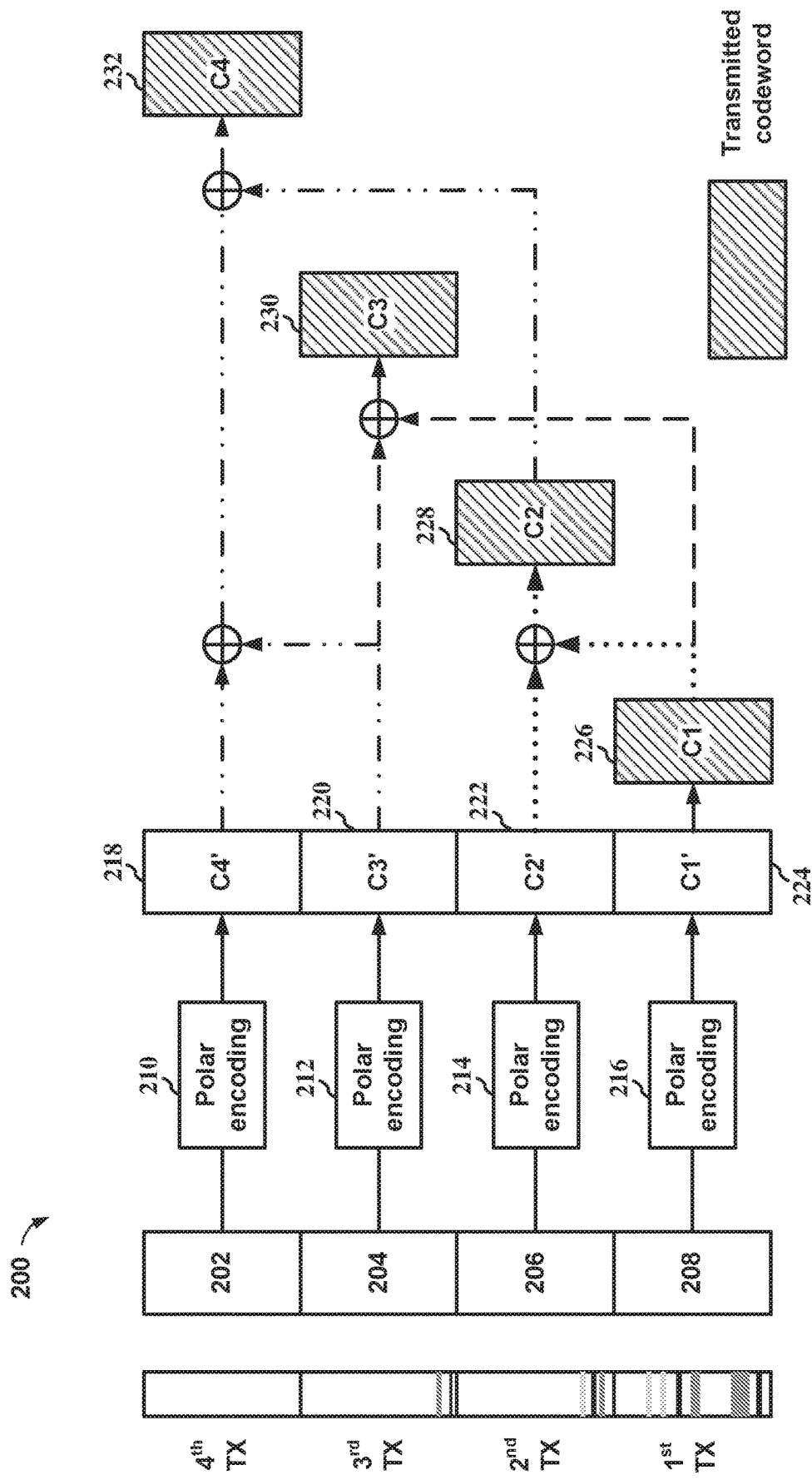
FIG. 2 is an example of an encoder structure for incremental redundancy (IR) HARQ in accordance with various aspects of the present disclosure.

FIG. 2 shows an incremental redundancy (IR) HARQ encoding scheme 200 in accordance with various aspects of the present disclosure. In an aspect, the IR-HARQ encoding scheme 200 may utilize the recursive structure of polar codes. In an example, for a first transmission (block 208), a polar code ($M_1$, K) with $M_1$ for the code block size, and K for the number of information bits being constructed by rate matching from a mother code length of $N_1$. For each retransmission (e.g., a second transmission (block 206), a third transmission (block 204), or a fourth transmission (block 202)), the mother code length may be extended from $N_1$ to $\beta \times N_1$ (e.g., where $\beta$ may be 2, 3, or 4, etc.), and the encoder (e.g., polar encoding at block 210, block 212, block 214, or block 216) may generate a longer codeword (e.g., a codeword at block 218, block 220, block 222, or block 224) with redundant information bits, but may only transmit the incremental redundancy part as shown in FIG. 2.

In other words, regarding the code block length for each retransmission (e.g., codeword $C_2$, codeword $C_3$, or codeword $C_4$ in FIG. 2), the IR-HARQ encoding scheme 200 may use a multiple of the block length of the first transmission (e.g., codeword $C_1$ at block 226), e.g., $M_i = \beta \times M_1$, where $\beta$ may be 2, 3, or 4, etc., and i is the number of transmission (e.g., first TX, second TX, third TX, fourth TX, etc.) in each retransmission, only the incremental redundancy part (e.g., block 228, block 230, or block 232) of a longer codeword is transmitted which is XOR with the codeword of the first transmission. The multiple block length restriction may not support flexible and fine coding rate adaptation for retransmission according to channel condition. In an example, during retransmission(s), rate may be changed to R/2, R/3, R/4, etc., where R is the rate of the first transmission. If the desired rate for the second transmission is between R/2 and R/3, the lower rate R/3 may be selected, resulting in allocating maximum of R/6 resources for retransmission(s).

Figure 3:
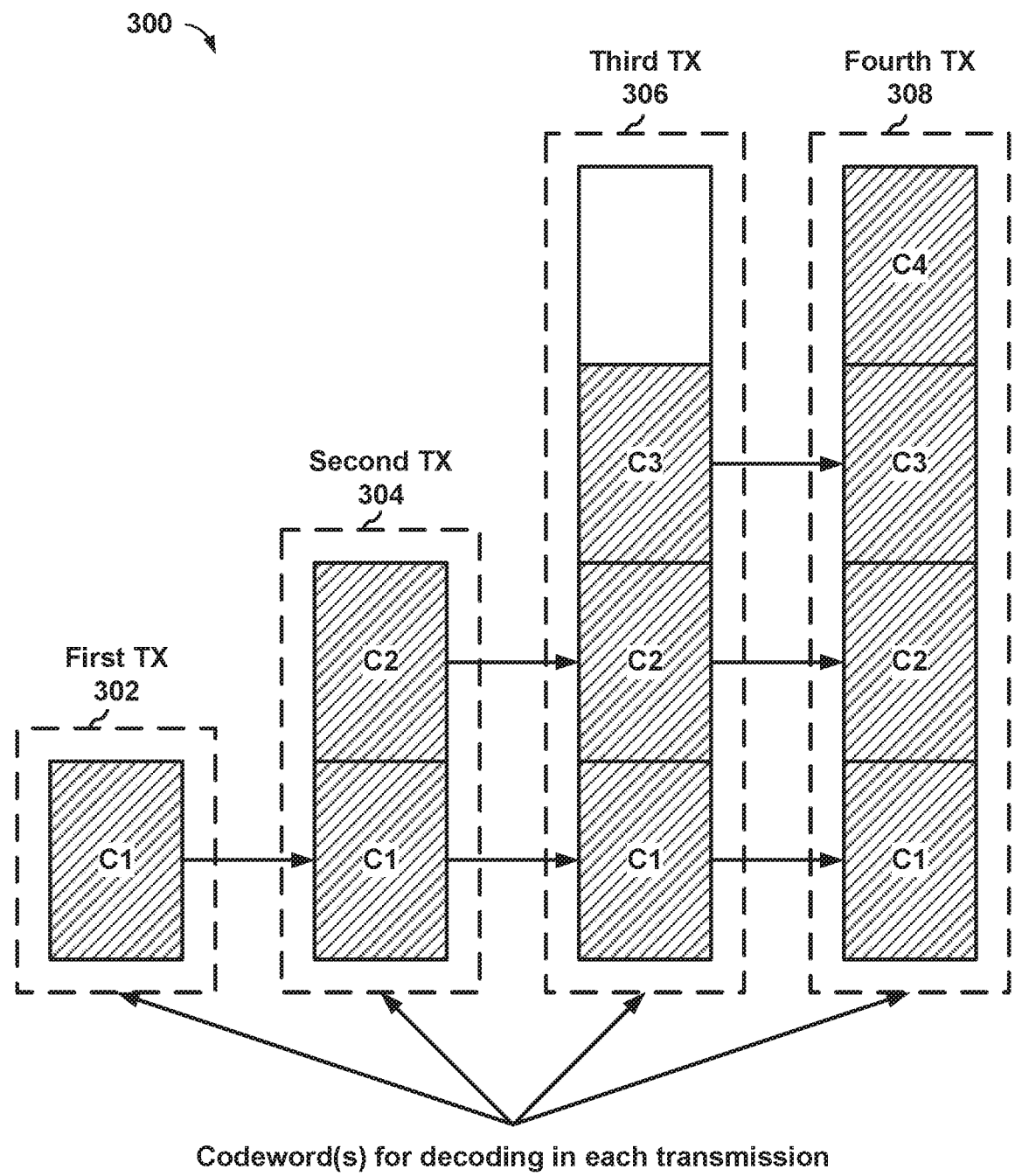
FIG. 3 is an example of decoding IR HARQ transmissions in accordance with various aspects of the present disclosure.

FIG. 3 shows a decoding scheme 300 for decoding IR HARQ transmissions in accordance with various aspects of the present disclosure. In an aspect of the decoding scheme 300, at the receiving side, the received log-likelihood ratios (LLRs) of all transmissions (e.g., first transmission 302, second transmission 304, third transmission 306, and/or fourth transmission 308) are combined and decoded as a long codeword of $\beta \times N_1$. For example, for the second transmission 304, the decoding scheme 300 (e.g., using an IR-HARQ decoder) may need to decode both the codeword $C_1$ and codeword $C_2$, as a long codeword of $2 \times N_1$, where $\beta = 2$.

Still referring to the decoding scheme 300, the incremental redundancy codeword may be a lower part of a long codeword, and therefore may be not self-decodable. If the channel condition for the first transmission is very bad (e.g., high interference), for example, the received LLRs are very small not able to contribute to the decoding, retransmission (e.g., the second transmission 304, the third transmission 306, and/or the fourth transmission 308) may fail also by decoding only the incremental redundancy codeword even when the channel condition(s) for the second transmission (e.g., the second transmission 304) is very good (e.g., low interference).

Figure 4:
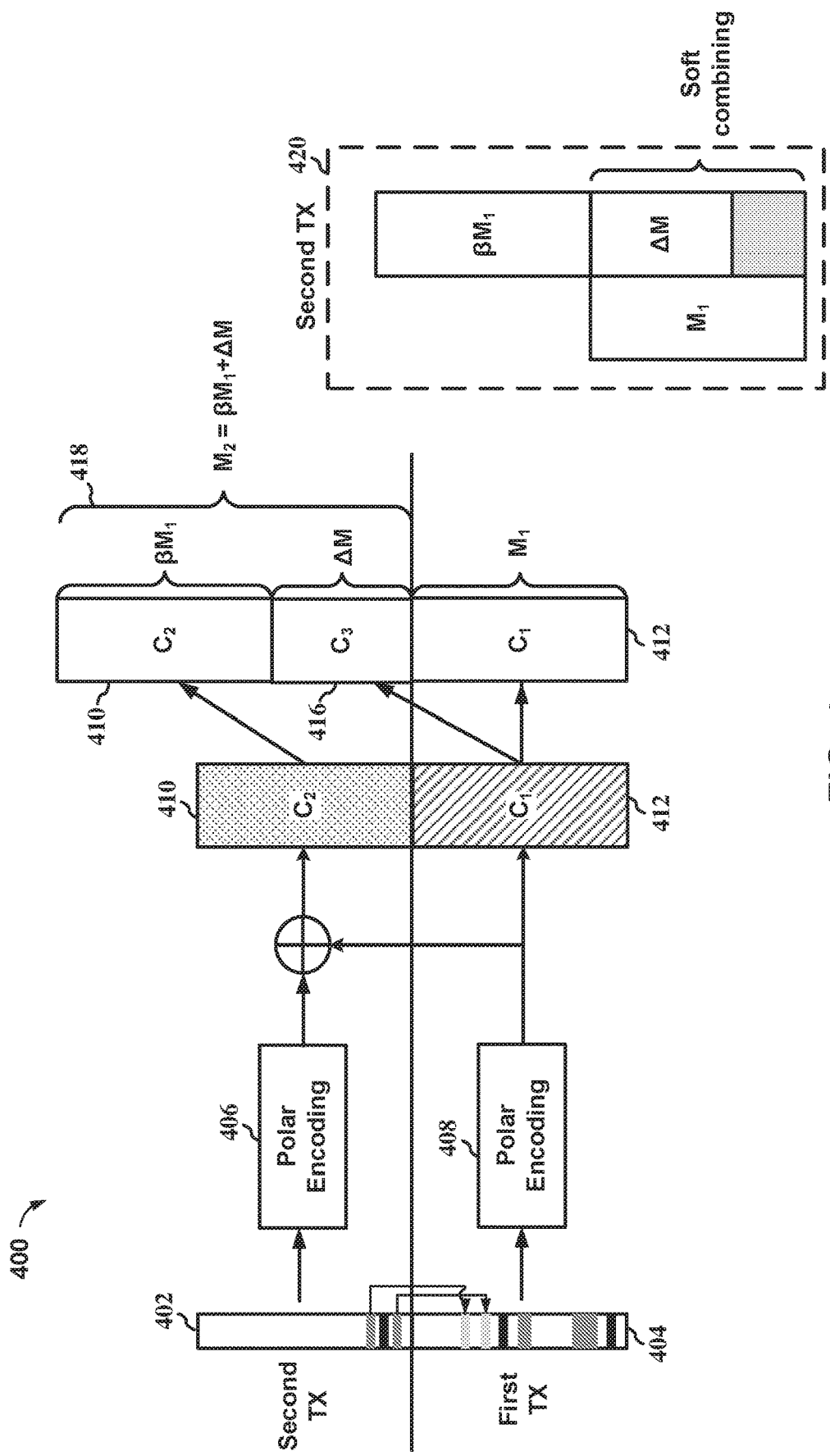
FIG. 4 is an example of generating hybrid codeword(s) for HARQ transmission(s) and/or retransmission(s) in accordance with various aspects of the present disclosure.

In an aspect, FIG. 4 shows an example of generating hybrid codeword(s) for HARQ transmission(s) and/or retransmission(s) in accordance with various aspects of the present disclosure. In an aspect, for each retransmission, a HARQ scheme 400 using hybrid chase combining codeword and incremental redundancy codeword for transmission(s) may be supported. In another aspect, either one of a chase combining codeword and/or an incremental redundancy codeword may be transmitted in retransmission(s).

Referring to FIG. 4, in an example, the data of a first transmission ($1^{st}$ TX) 404 is encoded by a polar encoder 408 to generate a first codeword 412 (or codeword and the data of a second transmission ($2^{nd}$ TX or the first retransmission) 402 is encoded by a polar encoder 406 to generate a second codeword. 410 (or codeword $C_2$). As noted above, for each retransmission (e.g., $2^{nd}$ TX), the encoded polar code from polar encoder 408 is also used for generating a third codeword 416 (or codeword $C_3$). In an implementation, the codeword 412 (or codeword $C_1$) is generated based on a code block length $M_1$ for the $1^{st}$ TX, and a codeword 410 (or codeword $C_2$) is generated based on the code block length $\beta \times M_1$, where $\beta$ may be 2, 3, or 4, etc., and the codeword 416 (or codeword $C_3$) is generated based on the code block length $\Delta M$, where $\Delta M < M_1$. In an aspect, a codeword 418 for the second transmission ($2^{nd}$ TX) may include two parts. The first part may be the codeword 410 (e.g., an incremental redundancy codeword) with a code block length $\beta \times M_1$, and the code block length of the codeword 410 (e.g., an incremental redundancy codeword) is determined by floor($M_2$/$M_1$)$\times M_1$. The second part may be the codeword 416 (e.g., a chase combining codeword) with a code block length $\Delta M$ (e.g., $\Delta M$ may be from 20% to 100% of $M_1$, and/or may be decided by the network), and the code block length of the codeword 416 (e.g., a chase combining codeword) may be determined by the remaining part, e.g., $M_2$−floor($M_2$/$M_1$)$\times M_1$. In this example, the codeword 418 may have a code block length $M_2 = \beta \times M_1 + \Delta M$. In an aspect, the codeword 416 (e.g., a chase combining codeword) may be a repetition of part of the 1st TX codeword, and the codeword 412 (e.g., an incremental redundancy codeword) may be the lower part of a long codeword encoded with redundant information bits and XOR with the codeword of the $1^{st}$ TX. In another aspect, the decoding of the $2^{nd}$ TX codeword 418 may use soft combining (e.g., as shown in block 420), and $1^{st}$ TX codeword 412 with the code block length $M_1$ may be soft combined with the codeword 416 (e.g., a chase combining codeword) with a code block length $\Delta M$. In some implementations, for example, the chase combining codeword for a $3^{rd}$ TX or a later retransmission may use a code block length ΔM that is part of the codeword 412 (or 1$^{st}$ TX codeword), or part of the codeword 418 (or 2$^{nd}$ TX codeword).

FIG. 5 shows examples of construction of chase combining codeword(s) in diagram 500 in accordance with various aspects of the present disclosure. For example, in FIG. 5, a first option and/or a second option discussed herein may be used for construction of a chase combining codeword (e.g., the codeword 418 in FIG. 4). In an example, the first transmission may have a polar code 502 with ($M_1$, K) bits, where $M_1$ (with multiple bits 510) is the number of bits (or the code block size), and K for the number of information bits being constructed by rate matching from a mother code length of $N_1$. For a first retransmission (or 2$^{nd}$ TX), a polar code 504 may have $N_1-M_1$ bits punctured (shown as bits 512), and may choose from the first option and second option discussed herein and shown in FIG. 5.

In an aspect, a polar code 506 may use the first option discussed herein, which copies the last $\Delta M=(M_2-\beta M_1)$ coded bits from the 1$^{st}$ TX polar code 502 (e.g., the code block $C_1$ in FIG. 4), where the repeated ΔM bits in 2$^{nd}$ TX is shown as bits 514.

In another aspect, a polar code 508 may use the second option discussed herein. In an example, construction of chase combining codeword using the second option (e.g., bit reversal based repetition) may be shown as following and in FIG. 5.

In an example, assuming $N_1=16$, $M_1=12$, and $\Delta M=6$, there may be 4 ($N_1-M_1=4$) bits to be punctured to obtain the first transmission code block $C_1$, the puncturing pattern is the bit-reversal of the last ($N_1-M_1$) indices, e.g., P=[15 (1111), 7(0111), 11(1011), 3(0011)]=[BitRev($N_1-1$), BitRev ($N_1-2$), . . . , BitRev($N_1-M_1$)]. In an aspect, for selecting ΔM repeated bits for second TX (e.g., block 514), puncturing additional ($M_1-\Delta M$) coded bits with the indices, P'=[13 (1101), 5(0101), 9(1001), 1(0001), 14(1110), 6(0110)] and therefore the coded bits on indices R=[0(0000), 8(1000), 4(0100), 12(1100), 2(0010), 10(1010)]=[BitRev(0), BitRev (ΔM-2, BitRev(ΔM-1)].

Figure 6:
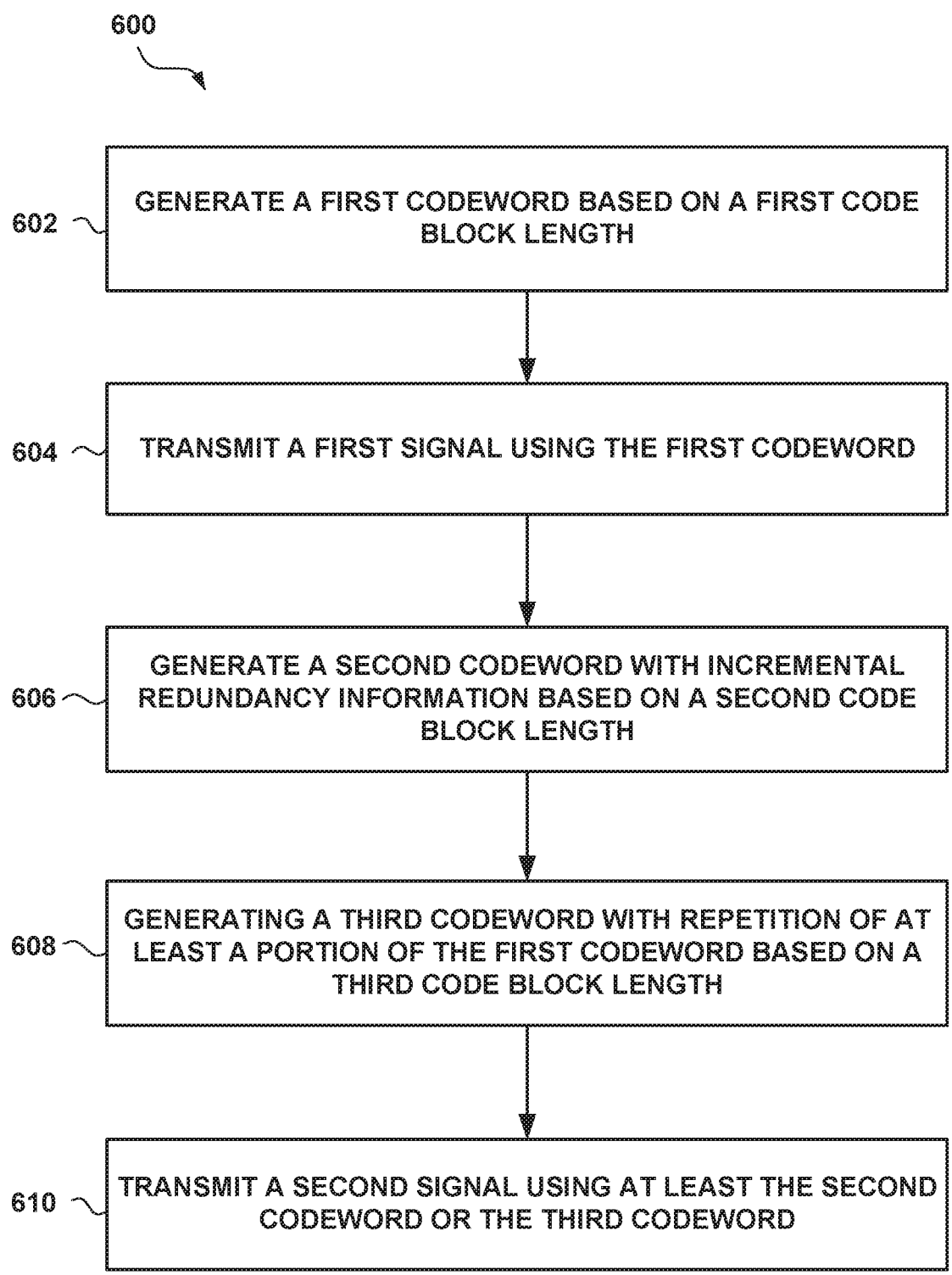
FIG. 6 is a flow diagram of an example method of wireless communications using HARQ according to one or more of the presently described aspects.

Referring to FIG. 6, in an operational aspect, a UE such as UE 12 and/or UE 14 (FIG. 1), or a base station (e.g., a gNB) such as network entity 20 (FIG. 1) may perform one aspect of a method 600 for hybrid HARQ transmission(s) or retransmission(s) in a wireless communications system (e.g., 5G NR). For example, one or more of the processors 103, the memory 130, the modem 108, the transceiver 106, the HARQ management component 40, the encoding component 42, the codeword generating component 44, and/or the code block length determining component 48, may be configured to perform aspects of the method 600.

In an aspect, at block 602, the method 600 may include generating a first codeword based on a first code block length. In an aspect, for example, the HARQ management component 40, the encoding component 42, the codeword generating component 44, and/or the code block length determining component 48, may be configured to generate a first codeword based on a first code block length.

In an aspect, at block 604, the method 600 may include transmitting a first signal using the first codeword. In an aspect, for example, the transceiver 106 and/or the HARQ management component 40 may be configured to transmit a first signal using the first codeword.

In an aspect, at block 606, the method 600 may include generating a second codeword with incremental redundancy information based on a second code block length. In an aspect, for example, the HARQ management component 40, the encoding component 42, the codeword generating component 44, and/or the code block length determining component 48, may be configured to generate a second codeword (e.g., an incremental redundancy codeword) with incremental redundancy information based on a second code block length.

In an aspect, at block 608, the method 600 may include generating a third codeword with repetition of at least a portion of the first codeword based on a third code block length. In an aspect, for example, the HARQ management component 40, the encoding component 42, the codeword generating component 44, and/or the code block length determining component 48, may be configured to generate a third codeword (e.g., a chase combining codeword) with repetition of at least a portion of the first codeword based on the third code block length.

In an aspect, at block 610, the method 600 may include transmitting a second signal using at least the second codeword or the third codeword. In an aspect, for example, the transceiver 106 and/or the HARQ management component 40 may be configured to transmit a second signal using at least the second codeword or the third codeword or both.

In some aspects, for example, the method 600 may be implemented by an apparatus for wireless communications using HARQ, and the apparatus may comprise a memory configured to store instructions, and at least one processor communicatively coupled with the memory, the at least one processor is configured to execute the instructions to generate a first codeword based on a first code block length, generate a second codeword with incremental redundancy information based on a second code block length, and generate a third codeword with repetition of at least a portion of the first codeword based on a third code block length. The apparatus may further comprise a transmitter communicatively coupled with the at least one processor and configured to transmit a first signal using the first codeword, and transmit a second signal using at least the second codeword or the third codeword.

In an aspect of the method 600 or the apparatus discussed above, at least one of the first codeword, the second codeword, or the third codeword uses polar codes.

In another aspect of the method 600 or the apparatus discussed above, the transmitter may be configured to transmit the first signal and the second signal over a data channel for URLLC.

In an aspect of the method 600 or the apparatus discussed above, the second codeword is an incremental redundancy codeword, and the third codeword is a chase combining codeword.

In an aspect of the method 600 or the apparatus discussed above, the at least one processor is configured to execute further instructions to repeat the first codeword with the third code block length.

In an aspect of the method 600 or the apparatus discussed above, the at least one processor is configured to execute further instructions to bit-reversal puncture the first codeword to the third code block length.

In an aspect of the method 600 or the apparatus discussed above, the second code block length is an integer multiple of the first code block length, and the third code block length is no larger than the first code block length.

In an aspect of the method 600 or the apparatus discussed above, the at least one processor is configured to execute further instructions to determine a fourth code block length for transmitting the second signal, and the transmitter is further configured to transmit the second signal using a hybrid codeword in response to a determination that the fourth code block length is not an integer multiple of the first code block length, and the hybrid codeword may include at least the second codeword and the third codeword.

Figure 7:
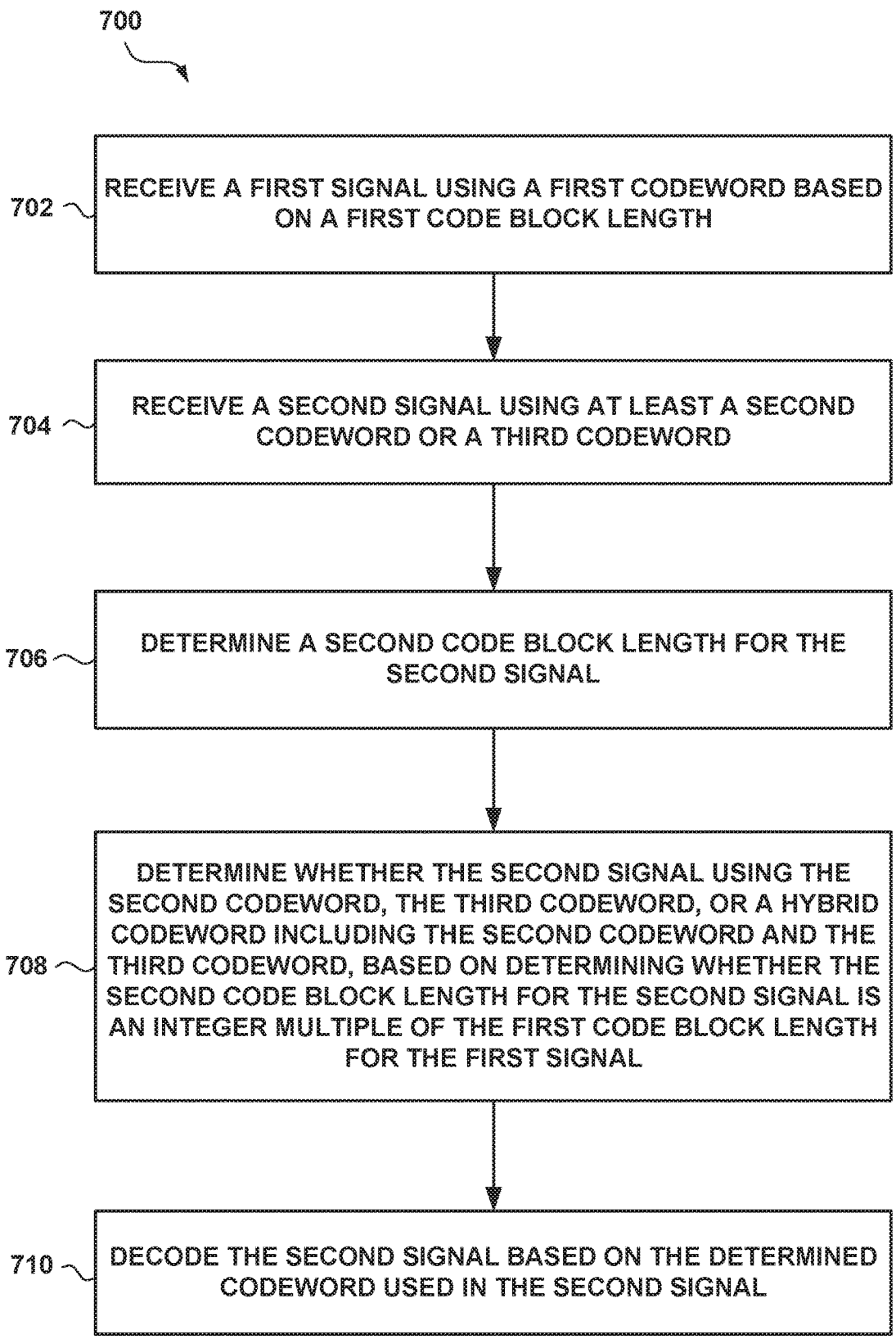
FIG. 7 is a flow diagram of another example method of wireless communications using HARQ according to one or more of the presently described aspects.

Referring to FIG. 7, in an operational aspect, a UE such as UE 12 and/or UE 14 (FIG. 1), or a base station (e.g., a gNB) such as network entity 20 (FIG. 1) may perform one aspect of a method 700 for wireless communications using hybrid codeword(s) for HARQ transmissions in a wireless communications system (e.g., 5G NR). For example, one or more of the processors 103, the memory 130, the modem 108, the transceiver 106, the HARQ management component 40, the codeword generating component 44, the decoding component 46, and/or the code block length determining component 48, may be configured to perform aspects of the method 700.

In an aspect, at block 702, the method 700 may include receiving a first signal using a first codeword based on a first code block length. In an aspect, for example, the transceiver 106 and/or the HARQ management component 40 may be configured to receive a first signal using a first codeword based on a first code block length.

In an aspect, at block 704, the method 700 may include receiving a second signal using at least a second codeword or a third codeword. In an aspect, for example, the transceiver 106 and/or the HARQ management component 40 may be configured to receive a second signal using at least a second codeword (e.g., an incremental redundancy codeword) or a third codeword (e.g., a chase combining codeword).

In an aspect, at block 706, the method 700 may include determining a second code block length for the second signal. In an aspect, for example, the HARQ management component 40 and/or the code block length determining component 48, may be configured to determine the code block length for the second signal.

In an aspect, at block 708, the method 700 may include determining whether the second signal using the second codeword, the third codeword, or a hybrid codeword including the second codeword and the third codeword, based on determining whether the second code block length for the second signal is an integer multiple of the first code block length for the first signal. In an aspect, for example, the HARQ management component 40 and/or the code block length determining component 48, may be configured to determine whether the second signal using the second codeword, the third codeword, or a hybrid codeword including the second codeword and the third codeword, based on determining whether the second code block length for the second signal is an integer multiple of the first code block length for the first signal.

In an aspect, at block 710, the method 700 may include decoding the second signal based on the determined codeword used in the second signal. In an aspect, for example, the HARQ management component 40 and/or the decoding component 46, may be configured to decode the second signal based on the determined codeword used in the second signal.

In some aspects, for example, the method 700 may be implemented by an apparatus for wireless communications using HARQ, and the apparatus may comprise a receiver configured to receive a first signal using a first codeword based on a first code block length, and a second signal using at least a second codeword or a third codeword. In addition, the apparatus may comprise a memory configured to store instructions and at least one processor communicatively coupled with the memory and the receiver. In an example, the at least one processor is configured to execute the instructions to determine a second code block length for the second signal; determine whether the second signal using the second codeword, the third codeword, or a hybrid codeword including the second codeword and the third codeword, based on determining whether the second code block length for the second signal is an integer multiple of the first code block length for the first signal; and decode the second signal based on the determined codeword used in the second signal.

In an aspect of the method 700 or the apparatus discussed above, at least one of the first codeword, the second codeword, or the third codeword uses polar codes.

In another aspect of the method 700 or the apparatus discussed above, the receiver is further configured to receive the first signal and the second signal over a data channel for URLLC.

In an aspect of the method 700 or the apparatus discussed above, the second codeword is an incremental redundancy codeword, and the third codeword is a chase combining codeword.

In another aspect of the method 700 or the apparatus discussed above, the at least one processor is configured to execute further instructions to determine whether the second signal uses at least the third codeword based on at least one of received log-likelihood ratios (LLRs) of the first codeword, or a polar code list decoding matrix of the first codeword.

In an aspect of the method 700 or the apparatus discussed above, a transmitter communicatively coupled with the at least one processor may be configured to transmit a HARQ feedback for the first codeword in response to a determination that the third codeword is used for transmitting the second signal. In an example, the HARQ feedback indicates a code block scaling factor used for the second codeword.

Several aspects of a telecommunications system have been presented with reference to an LTE/LTE-A or a 5G NR communications system. As those skilled in the art will readily appreciate, various aspects described throughout this disclosure may be extended to other telecommunication systems, network architectures and communication standards.

By way of example, various aspects may be extended to other communication systems such as High Speed Downlink Packet Access (HSDPA), High Speed Uplink Packet Access (HSUPA), High Speed Packet Access Plus (HSPA+) and TD-CDMA. Various aspects may also be extended to systems employing Long Term Evolution (LTE) (in FDD, TDD, or both modes), LTE-Advanced (LTE-A) (in FDD, TDD, or both modes), CDMA2000, Evolution-Data Optimized (EV-DO), Ultra Mobile Broadband (UMB), IEEE 802.11 (Wi-Fi), IEEE 802.16 (WiMAX), IEEE 802.20, Ultra-Wideband (UWB), Bluetooth, and/or other suitable systems. The actual telecommunication standard, network architecture, and/or communication standard employed will depend on the specific application and the overall design constraints imposed on the system.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of wireless communications using hybrid automatic repeat request (HARQ), comprising:
   generating a first codeword based on a first code block length;
   transmitting a first signal using the first codeword;
   generating a second codeword with incremental redundancy information based on a second code block length;
   generating a third codeword with repetition of at least a portion of the first codeword based on a third code block length;
   determining, for transmitting a second signal, whether a fourth code block length is an integer multiple of the first code block length; and
   transmitting the second signal using a hybrid codeword in response to a determination that the fourth code block length is not an integer multiple of the first code block length, wherein the hybrid codeword includes at least the second codeword and the third codeword.

2. The method of claim 1, wherein at least one of the first codeword, the second codeword, or the third codeword uses polar codes.

3. The method of claim 1, wherein the first signal and the second signal are transmitted over a data channel for ultra-reliable-low latency communications (URLLC).

4. The method of claim 1, wherein the second codeword is an incremental redundancy codeword, and the third codeword is a chase combining codeword.

5. The method of claim 1, wherein generating the third codeword comprises:
   repeating the first codeword with the third code block length.

6. The method of claim 1, wherein generating the third codeword comprises:
   bit-reversal puncturing the first codeword to the third code block length.

7. The method of claim 1, wherein the second code block length is an integer multiple of the first code block length, and the third code block length is no larger than the first code block length.

8. The method of claim 1, further comprising:
   receiving a HARQ feedback for the first codeword; and
   wherein transmitting the second signal using the hybrid codeword includes the hybrid codeword being based on the HARQ feedback.

9. An apparatus for wireless communications using hybrid automatic repeat request (HARQ), comprising:
   means for generating a first codeword based on a first code block length;
   means for transmitting a first signal using the first codeword;
   means for generating a second codeword with incremental redundancy information based on a second code block length;
   means for generating a third codeword with repetition of at least a portion of the first codeword based on a third code block length;
   means for determining, for transmitting a second signal, whether a fourth code block length is an integer multiple of the first code block length; and
   means for transmitting the second signal using a hybrid codeword in response to a determination that the fourth code block length is not an integer multiple of the first code block length, wherein the hybrid codeword includes at least the second codeword and the third codeword.

10. The apparatus of claim 9, wherein at least one of the first codeword, the second codeword, or the third codeword uses polar codes.

11. The apparatus of claim 9, wherein the first signal and the second signal are transmitted over a data channel for ultra-reliable-low latency communications (URLLC).

12. The apparatus of claim 9, wherein the second codeword is an incremental redundancy codeword, and the third codeword is a chase combining codeword.

13. The apparatus of claim 9, wherein the means for generating the third codeword comprises means for repeating the first codeword with the third code block length.

14. The apparatus of claim 9, wherein the means for generating the third codeword comprises means for bit-reversal puncturing the first codeword to the third code block length.

15. The apparatus of claim 9, wherein the second code block length is an integer multiple of the first code block length, and the third code block length is no larger than the first code block length.

16. The apparatus of claim 9, further comprising:
   means for receiving a HARQ feedback for the first codeword; and
   wherein the means for transmitting the second signal using the hybrid codeword includes the hybrid codeword being based on the HARQ feedback.

17. A method of wireless communications using hybrid automatic repeat request (HARQ), comprising:
   receiving, from a device, a first signal using a first codeword based on a first code block length;
   receiving, from the device, a second signal using a hybrid codeword including a second codeword and a third codeword based on the device determining a fourth code block length of a fourth codeword scheduled for the second signal is an integer multiple of the first code block length for the first signal; and decoding the second signal based on the hybrid codeword used in the second signal.

18. The method of claim 17, wherein at least one of the first codeword, the second codeword, or the third codeword uses polar codes.

19. The method of claim 17, wherein the first signal and the second signal are received over a data channel for ultra-reliable-low latency communications (URLLC).

20. The method of claim 17, wherein the second codeword is an incremental redundancy codeword, and the third codeword is a chase combining codeword.

21. The method of claim 17, further comprising:
determining whether the second signal uses at least the third codeword based on at least one of received log-likelihood ratios (LLRs) of the first codeword, or a polar code list decoding matrix of the first codeword.

22. The method of claim 17, further comprising transmitting a HARQ feedback indicating a code block scaling factor used for the second codeword.

23. An apparatus for wireless communications using hybrid automatic repeat request (HARQ), comprising:
means for receiving, from a device, a first signal using a first codeword based on a first code block length;
means for receiving, from the device, a second signal using a hybrid codeword including a second codeword and a third codeword based on the device determining a fourth code block length of a fourth codeword scheduled for the second signal is an integer multiple of the first code block length for the first signal; and
means for decoding the second signal based on the hybrid codeword used in the second signal.

24. The apparatus of claim 23, wherein at least one of the first codeword, the second codeword, or the third codeword uses polar codes, and wherein the second codeword is an incremental redundancy codeword, and the third codeword is a chase combining codeword.

25. The apparatus of claim 23, wherein the first signal and the second signal are received over a data channel for ultra-reliable-low latency communications (URLLC).

26. The apparatus of claim 23, further comprising:
means for determining whether the second signal uses at least the third codeword based on at least one of received log-likelihood ratios (LLRs) of the first codeword, or a polar code list decoding matrix of the first codeword.

27. The apparatus of claim 23, further comprising:
means for transmitting a HARQ feedback for the first codeword in response to a determination that the third codeword is used for transmitting the second signal, wherein the HARQ feedback indicates a code block scaling factor used for the second codeword.

* * * * *